US010193513B2

(12) United States Patent
Xu

(10) Patent No.: US 10,193,513 B2
(45) Date of Patent: Jan. 29, 2019

(54) OPTICAL AMPLIFIER BASED ON ELECTRO-OPTIC EFFECT FOR ELECTRICAL SIGNALS AND ITS APPLICATION AS SEMICONDUCTOR RADIATION DETECTOR PREAMPLIFIER

(71) Applicant: Xiaochao Xu, Vernon Hills, IL (US)

(72) Inventor: Xiaochao Xu, Vernon Hills, IL (US)

( * ) Notice: Subject to any disclaimer, the term of this patent is extended or adjusted under 35 U.S.C. 154(b) by 244 days.

(21) Appl. No.: 15/142,561

(22) Filed: Apr. 29, 2016

(65) Prior Publication Data

US 2016/0329871 A1 Nov. 10, 2016

Related U.S. Application Data

(60) Provisional application No. 62/157,437, filed on May 5, 2015.

(51) Int. Cl.
*H03F 17/00* (2006.01)
*G01T 1/24* (2006.01)
*G02F 1/03* (2006.01)

(52) U.S. Cl.
CPC ............ *H03F 17/00* (2013.01); *G01T 1/244* (2013.01); *G01T 1/247* (2013.01); *G02F 1/0327* (2013.01)

(58) Field of Classification Search
CPC ......... H03F 17/00; G01T 1/247; G01T 1/244; G02F 1/0327
USPC ..................................................... 250/370.04
See application file for complete search history.

(56) References Cited

U.S. PATENT DOCUMENTS

| 2004/0208638 A1* | 10/2004 | Jansen | ............... H04B 10/2513 398/183 |
| 2005/0135620 A1* | 6/2005 | Kastella | ................ H04L 9/0858 380/256 |
| 2009/0103736 A1* | 4/2009 | Pacher | ................... B82Y 10/00 380/278 |

OTHER PUBLICATIONS

Miao Yang, Claire Gu, and John Hong, "Electro-optic Michelson-Gires-Tournois modulator for optical information processing and optical fiber communications," Opt. Lett. 24, 1239-1241 (1999).*
G.F. Knoll, Radiation Detection and Measurement, 4 ed. (John Wiley & Sons, Hoboken, NJ, 2010).
H. Spieler, Semiconductor Detector Systems. (OUP Oxford, 2005).
D.J. Mar, R.M. Westervelt, P.F. Hopkins, "Cryogenic field-effect transistor with single electronic charge sensitivity," Applied Physics Letters 64, 631-633 (1994).
M. Yang, C. Gu, J. Hong, "Electro-optic Michelson Gires Tournois modulator for optical information processing and optical fiber communications," Opt. Lett. 24, 1239-1241 (1999).
C.A.J. Putman, B.G. De Grooth, N.F. Van Hulst, J. Greve, "A theoretical comparison between interferometric and optical beam deflection technique for the measurement of cantilever displacement in AFM," Ultramicroscopy 42-44, Part 2, 1509-1513 (1992).

(Continued)

*Primary Examiner* — David Porta
*Assistant Examiner* — Gisselle Gutierrez

(57) ABSTRACT

An amplifier for amplification of an electrical signal comprises an electro-optic (EO) medium for receiving the electrical signal, wherein applying the electrical signal to the EO medium causes a change to an effective index of refraction, a device configured for measuring a light phase change for measuring the change to the effective index of refraction, and a photodetector configured to convert the change to the effective index of refraction into an amplified electrical current output signal.

20 Claims, 5 Drawing Sheets

(56) References Cited

OTHER PUBLICATIONS

Taylor & Francis, "Elasto-Optic, Electro-Optic, and Magneto-Optic Constants," in CRC Handbook of Chemistry and Physics, edited by W.M. Haynes (2014).
Altechna, "SBN crystals parameters table." http://www.altechna.com/download/Rutos/SBN.pdf, Retrieved Oct. 16, 2014.
V. Giovannetti, S. Lloyd, L. Maccone, "Advances in quantum metrology," Nature Photonics 5, 222-229 (2011).
V. Giovannetti, S. Lloyd, L. Maccone, "Quantum-Enhanced Measurements: Beating the Standard Quantum Limit," Science 306, 1330-1336 (2004).
H. Callen, T. Welton, "Irreversibility and Generalized Noise," Physical Review 83, 34-40 (1951).

* cited by examiner

OPTICAL AMPLIFIER BASED ON ELECTRO-OPTIC EFFECT FOR ELECTRICAL SIGNALS AND ITS APPLICATION AS SEMICONDUCTOR RADIATION DETECTOR PREAMPLIFIER

CROSS-REFERENCE TO RELATED APPLICATIONS

The present application claims the benefit of priority to U.S. Provisional Patent Application No. 62/157,437, filed May 5, 2015, titled "OPTICAL AMPLIFIER BASED ON ELECTRO-OPTIC EFFECT FOR ELECTRICAL SIGNALS AND ITS APPLICATION AS SEMICONDUCTOR RADIATION DETECTOR PREAMPLIFIER", which is hereby incorporated by reference in its entirety.

FIELD

The present invention relates generally to signal amplification and more particularly, to an electrical signal amplifier.

BACKGROUND

Among commonly used radiation detectors, semiconductor detectors have the advantage of good energy resolution compared with scintillator detectors. And semiconductor detectors of small size can be very fast. This is because that the time required to collect the carriers over a typical length of 1 mm can be less than 10 ns for a typical semiconductor like silicon. However, for detecting low energy particles, this fast timing is usually not achievable if we need reasonable energy resolution at the same time. This is because the signal generated by the low energy (less than a few hundred keV) particles is small (the signal is proportional to the energy of the particles) and signal to noise ratio is low. If we want fast timing, we will need to increase the bandwidth of the preamplifier, which will in turn increase the series noise of the preamplifier. And for fast detection, the series noise of preamplifier dominates the noise. With large noise, the energy resolution worsens.

Accordingly, there is a need for a signal amplifier that overcomes the shortcomings stated above.

SUMMARY OF THE INVENTION

The present invention aims to address the above-cited limitations by providing a signal amplifier for amplification of an electrical signal comprising an electro-optic (EO) medium for receiving the electrical signal, wherein applying the electrical signal to the EO medium causes a change to an effective index of refraction, a device configured for measuring a light phase change for measuring the change to the effective index of refraction, and a photodetector configured to convert the change to the effective index of refraction into an amplified electrical current output signal.

In related versions, the device configured for measuring the light phase change is an interferometer comprising a monochromatic laser source directed towards the EO medium to measure the change to the effective index of refraction.

In related versions, the EO medium comprises a Gires-Tournois etalon (GTE).

In related versions, entangled photons are used for detection.

In related versions, the EO medium is connected to a semiconductor x-ray/γ-ray/charged particle detector for receiving an electrical charge signal generated by the semiconductor x-ray/γ-ray/charged particle detector, to act as a charge sensitive detector to measure energy and timing information of particles impacting the radiation detector.

In related versions, the radiation detector is connected in series to the EO medium.

In related versions, the radiation detector is connected in parallel to the EO medium.

A preamplifier for amplification of an electrical signal for detection by a semiconductor radiation detector comprises an electro-optic (EO) medium comprising a first mirror and a second mirror for receiving the electrical signal, wherein applying the electrical signal to the EO medium causes a change to an effective index of refraction, a monochromatic laser source configured to emit a laser towards the EO medium directly or indirectly to bounce inside the EO medium many times in order to increase a phase shift of the laser, a device configured for measuring the change to the effective index of refraction, and a photodetector configured to convert the change to the effective index of refraction into an amplified electrical current output signal.

In related versions, the device configured for measuring the light phase change is an interferometer.

In related versions, the EO medium comprises a Gires-Tournois etalon (GTE).

In related versions, entangled photons are used for detection.

In related versions, the EO medium is connected to a semiconductor x-ray/γ-ray/charged particle detector for receiving an electrical charge signal generated by the semiconductor x-ray/γ-ray/charged particle detector, to act as a charge sensitive detector to measure energy and timing information of particles impacting the radiation detector.

In related versions, the radiation detector is connected in series to the EO medium.

In related versions, the radiation detector is connected in parallel to the EO medium.

A method of amplifying an electrical signal comprises receiving the electrical signal at an electro-optic (EO) medium comprising a first mirror and a second mirror, wherein applying the electrical signal to the EO medium causes a change to an effective index of refraction, emitting, using a monochromatic laser source, a laser either directly or indirectly towards the EO medium to bounce inside the EO medium many times in order to increase a phase shift of the laser, measuring, using a device, the change to the effective index of refraction, and converting, using a photodetector, the change to the effective index of refraction into an amplified electrical current output signal.

In related versions, the device is an interferometer configured for measuring the light phase change.

In related versions, the EO medium comprises a Gires-Tournois etalon (GTE).

In related versions, the EO medium is connected to a semiconductor x-ray/γ-ray/charged particle detector for receiving an electrical charge signal generated by the semiconductor x-ray/γ-ray/charged particle detector, to act as a charge sensitive detector to measure energy and timing information of particles impacting the radiation detector.

In related versions, the radiation detector is connected either in series or parallel to the EO medium.

In related versions, entangled photons are used for detection.

The contents of this summary section are provided only as a simplified introduction to the invention, and are not intended to be used to limit the scope of the appended claims. The present disclosure has been described above in terms of presently preferred embodiments so that an understanding of the present disclosure can be conveyed. However, there are other embodiments not specifically described herein for which the present disclosure is applicable. Therefore, the present disclosure should not be seen as limited to the forms shown, which should be considered illustrative rather than restrictive.

BRIEF DESCRIPTION OF THE DRAWINGS

Other systems, methods, features and advantages of the present invention will be or will become apparent to one of ordinary skill in the art upon examination of the following figures and detailed descriptions. It is intended that all such additional apparatuses, systems, methods, features and advantages be included within this description, be within the scope of the present invention, and be protected by the appended claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Figure 1:
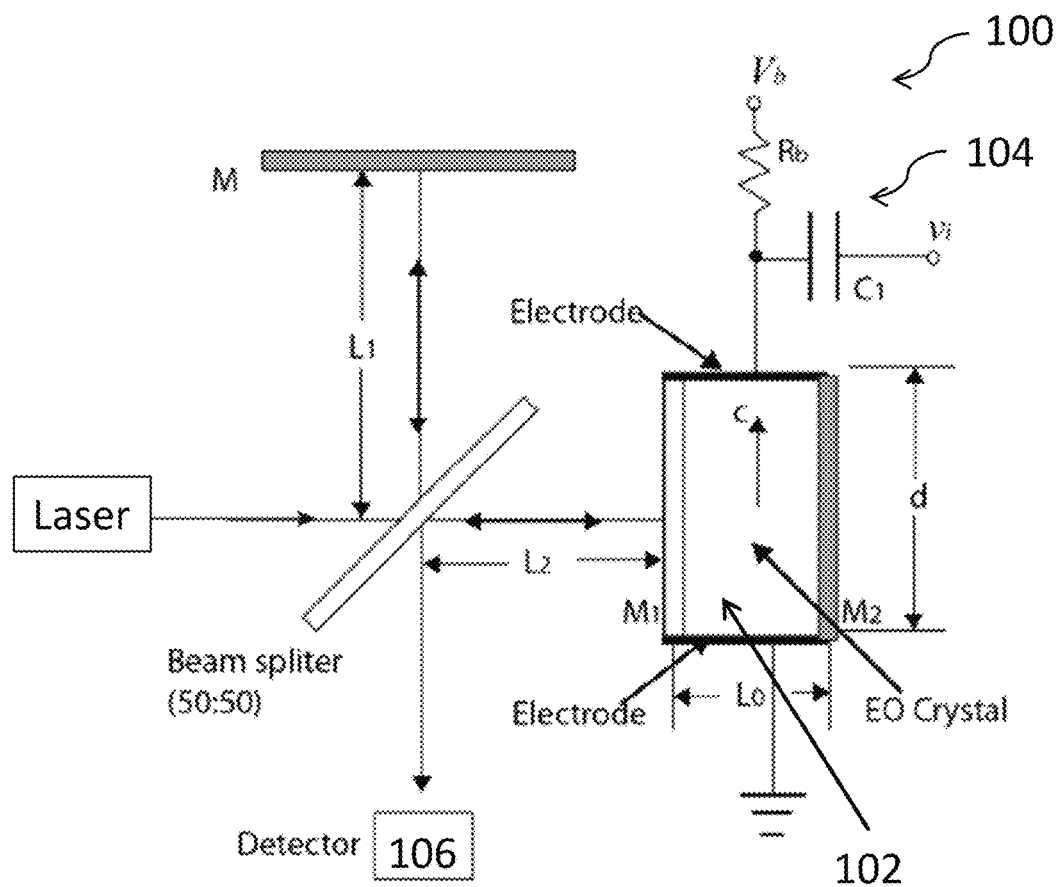
FIG. 1 is a schematic diagram of a signal amplifier.

FIG. 1 is schematic diagram of a signal amplifier 100 for amplification of an electrical signal comprising an electro-optic (EO) medium 102 having a Pockels' coefficient for receiving the electrical signal, wherein applying the electrical signal to the EO medium causes a change to an effective index of refraction, a device 104 (e.g., starting from where $v_i$ goes in) configured for measuring a light phase change for measuring the change to the effective index of refraction, and a photodetector 106 configured to convert the change to the effective index of refraction into an amplified electrical current output signal.

In related versions, the device configured for measuring the light phase change is an interferometer comprising a monochromatic laser source directed towards the EO medium to measure the change to the effective index of refraction.

In related versions, the EO medium comprises a Gires-Tournois etalon (GTE).

In related versions, the EO medium is connected to a semiconductor x-ray/γ-ray/charged particle detector for receiving an electrical charge signal generated by the semiconductor x-ray/γ-ray/charged particle detector, to act as a charge sensitive detector to measure energy and timing information of particles impacting the radiation detector.

In related versions, the radiation detector is connected in series to the EO medium.

In related versions, the radiation detector is connected in parallel to the EO medium.

In alternative versions, the amplifier can be a preamplifier for amplification of an electrical signal for detection by a semiconductor radiation detector that comprises an electro-optic (EO) medium comprising a first mirror and a second mirror for receiving the electrical signal, wherein applying the electrical signal to the EO medium causes a change to an effective index of refraction, a monochromatic laser source configured to emit a laser towards the EO medium directly or indirectly to bounce inside the EO medium many times in order to increase a phase shift of the laser, a device configured for measuring the change to the effective index of refraction, and a photodetector configured to convert the change to the effective index of refraction into an amplified electrical current output signal.

Figure 2:
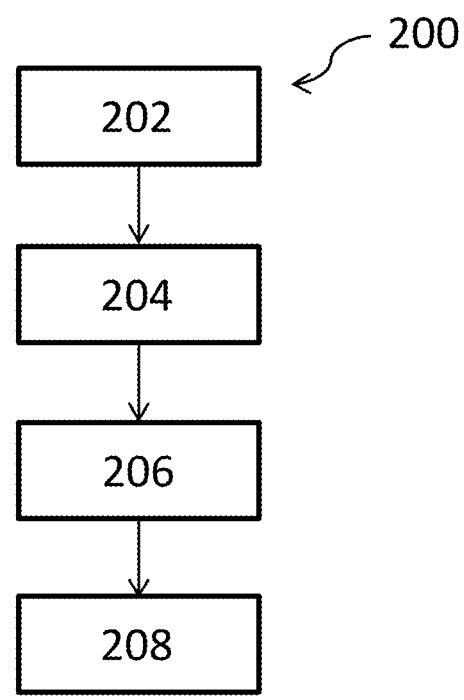
FIG. 2 is a flowchart depicting an exemplary embodiment of a method for amplifying a signal.

Referring to FIG. 2, a method 200 of amplifying an electrical signal comprises, at 202, receiving the electrical signal at an electro-optic (EO) medium comprising a first mirror and a second mirror, wherein applying the electrical signal to the EO medium causes a change to an effective index of refraction.

At 204, a monochromatic laser source emits a laser either directly or indirectly towards the EO medium to bounce inside the EO medium many times in order to increase a phase shift of the laser.

At 206, a device measures the change to the effective index of refraction.

At 208, a photodetector converts the change to the effective index of refraction into an amplified electrical current output signal.

In related versions, the device is an interferometer configured for measuring the light phase change.

In related versions, the EO medium comprises a Gires-Tournois etalon (GTE).

In related versions, the EO medium is connected to a semiconductor x-ray/γ-ray/charged particle detector for receiving an electrical charge signal generated by the semiconductor x-ray/γ-ray/charged particle detector, to act as a charge sensitive detector to measure energy and timing information of particles impacting the radiation detector.

In related versions, the radiation detector is connected either in series or parallel to the EO medium.

In related versions, the signal is connected to the EO medium, and entangled photons are used for detection. For example, the usage of entangled photons can be not limited to radiation detectors. They can be used for any signal, either from a radiation detector or other electrical signal source.

First Use Example: Optical Amplifier Based on Electro-Optic Effect for Electrical Signals and its Application as Semiconductor Radiation Detector Preamplifier The detection of low energy particles, especially x-ray or γ-ray photons, is very important in various applications in medical imaging, homeland security and other. One particular application is in spectral x-ray imaging, which is expected to be a major breakthrough in medical x-ray imaging (spectral CT etc.) in the near future. Therefore, a detector or detector array with both good energy resolution and fast timing is needed for a breakthrough in spectral x-ray imaging. One of the keys to this is to achieve a fast preamplifier with low noise.

In a commonly used semiconductor radiation detector, the input stage of the preamplifier, which has the predominant role in determining the noise performance of the preamplifier, is a field effect transistor (FET). The normally dominant contributor of the series noise is the thermal noise (Johnson-Nyquist noise). The spectral density of the noise current at the drain of a FET is due to channel resistance $R_{ch}$ $$i_{nD}^2 = \frac{4k_B T_e}{R_{ch}} = \frac{N_t e}{L^2} \mu_0 4k_B T_e \quad (1)$$

where $N_t$ is the total number of charge carriers in the FET channel, L is the length of the FET channel, e is the electron charge, $\mu_0$ is the mobility of the channel material, and $k_B T_e$ is the thermal energy of the electrons. Most of the above FET parameters have been optimized for best noise performance in a good preamplifier and the only other parameter can be tuned is the temperature of the FET. To lower the noise, the FET can be cooled to a lower temperature. This is the case for a germanium detector, whose preamplifier FET is cooled to liquid nitrogen temperature (78 K). Further lowering the temperature to liquid Helium temperature (4.2 K) should lower the noise greatly. Regular silicon FET will not work at this temperature, although special low noise FET can be made to work at this temperature to obtain very high charge sensitivity. However, cooling the preamplifier to liquid Helium temperature is a very challenging task for normal detector operation; therefore a low noise preamplifier which works at room temperature could be very appealing for fast detector with good energy resolution.

Note that the thermal noise of a system is closely related to the dissipation of the system via the fluctuation-dissipation theorem. For the FET noise current, the noise source is the channel resistance, which is a source of dissipation. For the semiconductor materials used to make the FETs, there are always limits in their properties and it is impossible to decrease the noise greatly for the already optimized preamplifier. But this relationship can point us to look for an amplifier whose medium is dissipationless or near dissipationless. Here is proposed an optical amplifier using electro-optic (EO) effects; specifically using the Pockels' effect. But the same principle is also applicable for using Kerr effect. EO effects are very fast and can achieve GHz speed in modulation applications. However, the effects are very small and normally needs large voltages (order of 1000V) to operate. By making the EO medium a Gires-Tournois etalon (GTE) and using an interferometry setup, the signal can be amplified sufficiently to work as a fast and low-noise amplifier.

Second Use Example: Optical Amplifier Based on Electro-Optic Effect for Voltage Signals FIG. 1 shows the setup of the amplifier. The basic setup is a Michelson interferometer. The reference arm of the interferometer is a regular 100% reflectance mirror M. The other arm is a GTE whose medium is an EO crystal with large Pockels' coefficient. In this figure, the $r_{33}$ coefficient can be used. However, it is possible to use other coefficient for this application. Unlike a standard electro-optic modulator, a large modulation of the EO crystal is not needed, therefore, the bias voltage $V_b$ will not need to be very high. The input signal to be amplified $v_i(t)$ is applied to the EO crystal via an isolation capacitor $C_1$.

The voltage at the EO crystal is $V_b$ $v_i$. The phase factor due to this voltage is $$\phi = \frac{2\pi}{\lambda} n_e L_0 - \frac{\pi}{\lambda} n_e^3 r_{eo} L_0 \frac{V_b + v_i}{d} = \phi_0 - \frac{\pi}{2} \frac{V_b + v_i}{V_\pi} = \phi_1 - \frac{\pi}{2} \frac{v_i}{V_\pi} \quad (2)$$

where $n_e$ is the extraordinary index of refraction of the EO crystal; $L_0$ and d are the thickness and the length of the EO crystal, respectively; $\phi_0$ is the initial phase of the GTE and $$\phi_1 = \phi_0 - \frac{\pi}{2} \frac{V_b}{V_\pi};$$

$\lambda$ is the wavelength of the laser source; $r_{eo}$ is the Pockels' coefficient of the EO crystal; and $$V_\pi = \frac{d\pi}{2n_e^3 r_{eo} L_0}$$

is the half-wave voltage.

The phase shift on reflection from the GTE is $$\Phi = -2\tan^{-1}\left(\frac{1+\sqrt{R}}{1-\sqrt{R}} \tan\phi\right) = -2\tan^{-1}(\beta \tan\phi), \quad (3)$$

where R is the reflectivity of the front mirror of the GTE, $M_1$, and $$\beta = \frac{1+\sqrt{R}}{1-\sqrt{R}}.$$

Figure 3A:
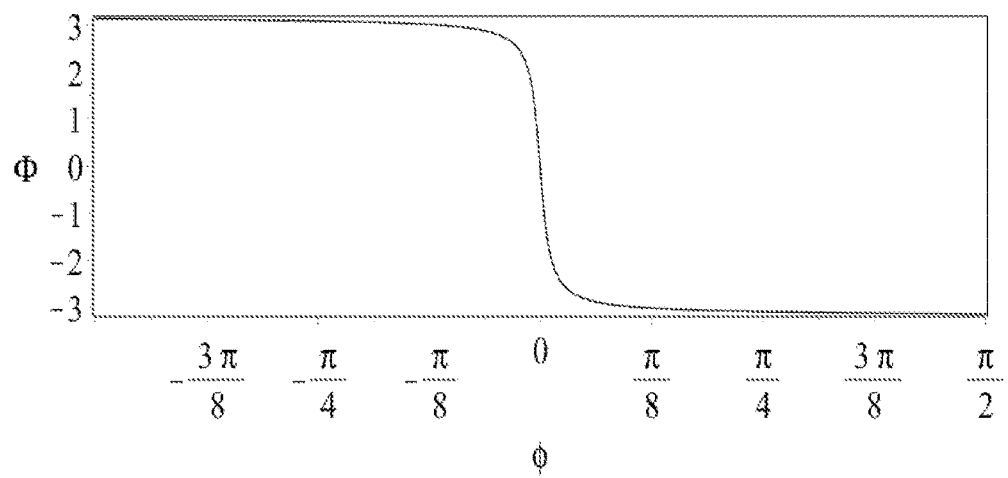
FIG. 3A is phase shift diagram.
Figure 3B:
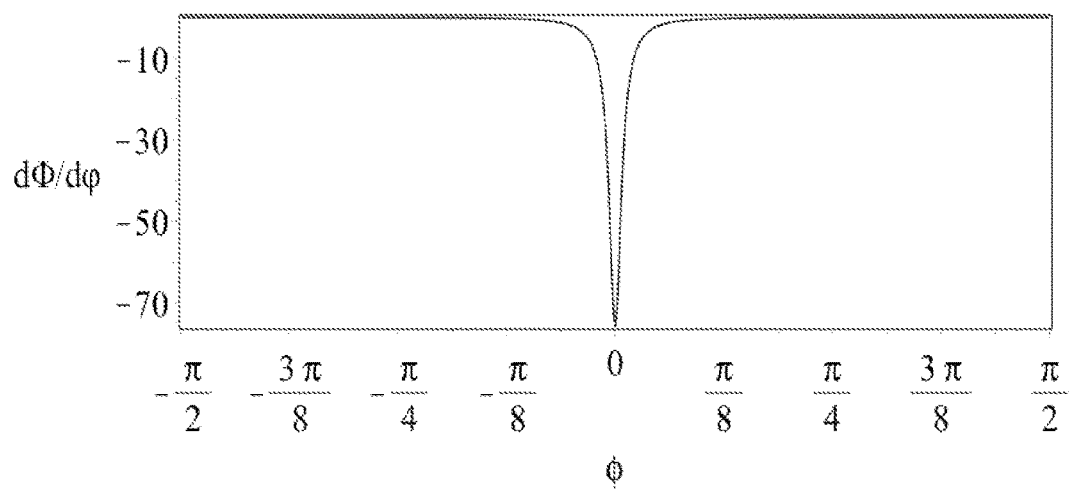
FIG. 3B is plot of $$\frac{d\Phi}{d\phi}.$$

The purpose of adding a GTE is to let the laser photons to bounce inside of the EO crystal for many times in order to increase the phase shift. This is needed in the examples listed below because normally Pockels or Kerr effect is very small effect for a small signal. FIG. 3A shows a plot of equation 3 for R=0.9. It can be seen that for $\phi$ near 0, $\Phi$ is sensitively dependent to small change of $\phi$. FIG. 3B shows $$\frac{d\Phi}{d\phi}$$

for the same R=0.9. The maximum amplification happens at $\phi=n\pi$, where n is an integer and the maximum amplification is $2\beta$.

Assuming the detector is ideal (quantum efficiency is 100% and no dark count, for the non-ideal cases, it can be easily accounted for by the quantum efficiency factor $\eta$), the output photon number in unit time detected by the detector is $$N_{out} = \frac{N_{tot}}{2}[1 + \cos(\Phi + 2\alpha)], \quad (4)$$

where $2\alpha=4\pi n_a \Delta L/\lambda$ is the phase difference between the two beams of the Michelson interferometer caused by the arm-length difference, $\Delta L = L_2 - L_1$ and $n_a$ is the index of refraction of the environment; and $N_{tot}$ is the total amount of photons emitted by the laser in unit time. This equation shows that the maximum photon number detected is equal to that of the source laser and the minimum is 0.

Plug equations 2 and 3 into equation 4, Taylor expand around $v_i = 0$ and take the leading term in $$\frac{v_i}{V_\pi}$$

(this term is normally very small as only a rather small signal $v_i$ is used, therefore the Taylor expansion will not give error), $$N_{out} = \frac{N_{tot}}{2}\left[1 + \cos(-2\tan^{-1}(\beta\tan\phi_1) + 2\alpha) - \frac{\pi}{2}\frac{v_i}{V_\pi}\frac{2\beta}{\cos^2\phi_1 + \beta^2\sin^2\phi_1}\sin(-2\tan^{-1}(\beta\tan\phi_1) + 2\alpha)\right], \quad (5)$$

The useful output term is the linear term in $$\frac{v_i}{V_\pi}$$

in equation 5. The maximum amplification is obtained at $\phi_1 = n\pi$ and $$2\alpha = \frac{\pi}{2} + m\pi,$$

where m and n are integers. At this condition, $$N_{out} = \frac{N_{tot}}{2}\left[1 - \frac{\pi\beta}{V_\pi}v_i\right], \quad (6)$$

Within time $\tau$, the change of number photons detected by the detector by apply a signal $v_i$ near $\phi_1 = \pi$ and $$2\alpha = \frac{\pi}{2} + m\pi$$

is $$\Delta N = -\frac{N_{tot}\tau}{2}\frac{\pi\beta}{V_\pi}v_i, \quad (7)$$

And signal-to-noise ratio (SNR) due to the photon shot noise is $$SNR = \frac{|\Delta N|}{\sqrt{\frac{N_{tot}\tau}{2}}} = \frac{\sqrt{2N_{tot}\tau}}{2}\frac{\pi\beta}{V_\pi}v_i = \sqrt{2N_{tot}\tau}\frac{\pi\beta n_e^3 r_{eo} L_o}{d\lambda}v_i, \quad (8)$$

However, this is not the maximum SNR obtainable by this setup. The reason is: although at $\phi_1 = n\pi$ and $$2\alpha = \frac{\pi}{2} + m\pi,$$

$\Delta N$ obtains its maximum, the measured photon fluctuation is larger.

Setting $\phi_1 = n\pi$, $$SNR = \frac{|\Delta N|}{\sqrt{\frac{N_{tot}\tau}{2}[1 + \cos(-2\tan^{-1}(\beta\tan\phi_1) + 2\alpha)]}} = \quad (9)$$

$$\frac{\sqrt{2N_{tot}\tau}}{2}\frac{\pi\beta}{V_\pi}\frac{|\sin(2\alpha)|}{\sqrt{1+\cos(2\alpha)}}v_i,$$

Figure 4:
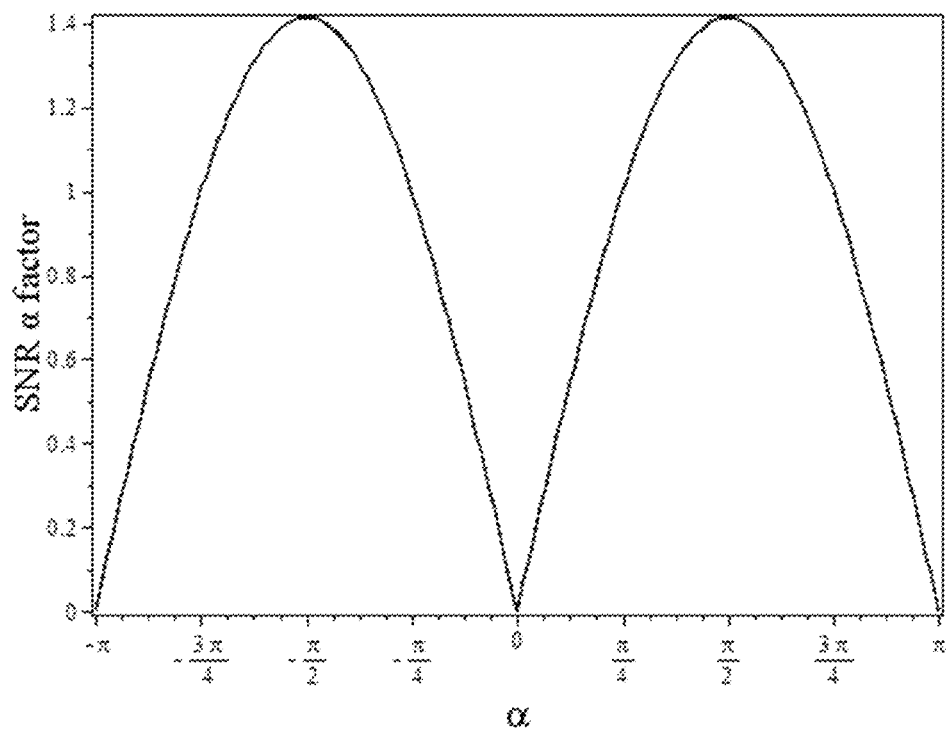
FIG. 4 is an SNR plot.

FIG. 4 shows a plot of $$\frac{|\sin(2\alpha)|}{\sqrt{1+\cos(2\alpha)}},$$

the maximum value is obtained at $$\alpha = \frac{\pi}{2} + m\pi.$$

However, at these values, $N_{out} = 0$, therefore there is no signal. When the photon detector has a small dark current, this will lower the SNR at $$\alpha = \frac{\pi}{2} + m\pi$$

greatly. However, FIG. 4 shows that if the mean signal saturates the detector, we can choose to work at some point $$\frac{\pi}{4} + m\pi < |\alpha| < \frac{\pi}{2} + m\pi$$

to lower the light intensity while still has good SNR and this may be important if it is desired to increase $N_{tot}$ to increase the SNR. It also shows that at this $\alpha$ range, the SNR does not change much and it is not necessary to stay at a particular $\alpha$, and this reduces the work of fine-tuning the optical path which could be difficult. However, because $\alpha$ will affect the detected mean light intensity, it will need to be stable or calibrated often. In the following discussion, equation 8 will be used as a typical SNR for this setup.

To compare with the noise of an ordinary transistor amplifier, the equivalent noise voltage at the input of our amplifier $v_{ni}$ is needed. The output $i_o$ of our amplifier from equation 7 is a current from the detector $$i_o = \frac{\Delta N}{\tau} \cdot e\eta = -\frac{N_{tot}}{2}\frac{\pi\beta}{V_\pi}e\eta v_i, \quad (10)$$

where $\eta$ is the quantum efficient of the detector. The transconductance of the amplifier is $$g_m = \frac{i_o}{v_i} = -\frac{N_{tot}}{2} \frac{\pi\beta}{V_\pi} e\eta. \quad (11)$$

The noise current at the output (for equation 6)

$$i_{no} = \sqrt{\frac{N_{tot}}{2\tau}} e\eta, \quad (12)$$

And the equivalent noise voltage at the input $v_{ni}$ $$v_{ni} = \frac{i_{no}}{g_m} = -\frac{\sqrt{2} V_\pi}{\pi\sqrt{N_{tot}\tau}\,\beta}, \quad (13)$$

Assuming a wavelength of 632 nm (He—Ne laser), a reflectivity R=99% ($\beta$=398), using the properties of Strontium-Barium Niobate ($Sr_xBa_{(1-x)}Nb_2O_6$) (SBN x=0.75), $r_{33}$=1340 pm/V, $n_e$=2.35, $L_0$=20 mm and d=4 mm, and $N_{tot}$=3.2×10$^{15}$ photons/s (1 mW laser power), a noise voltage of 0.07 nV/√Hz is obtained, and this is about one order of magnitude lower than the best low-noise room-temperature op amp (and about two orders of magnitude in noise power). Further reduction of the noise voltage can be achieved by increasing the laser power and/or varying the EO crystal geometry.

Third Use Example: Optical Amplifier Based on Electro-Optic Effect as Charge Sensitive Preamplifier for Semiconductor Detectors One application of above mentioned optical amplifier is to be used as a charge sensitive preamplifier for a semiconductor detector. In a good semiconductor detector with little charge trapping problem, the charge generated by a particle fully absorbed in the detector is determined by $$Q_s = \frac{E}{E_i} e, \quad (14)$$

where E is the absorbed energy, $E_i$ is the energy required to form a charge pair and it is 3.6 eV for silicon, and e is the electronic charge.

Figure 5A:
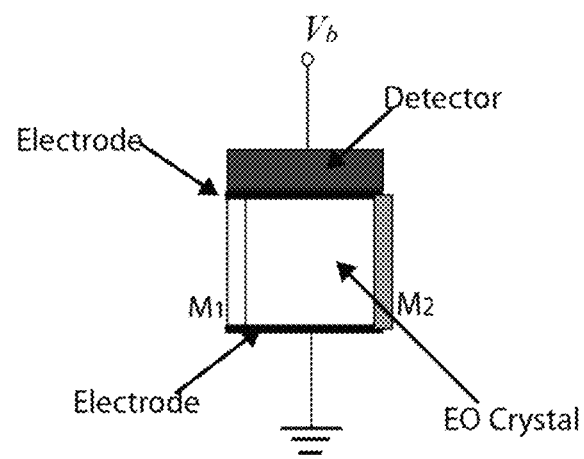
FIG. 5A is a schematic diagram of an optical amplifier connected in series with a semiconductor detector according to a signal amplifier described herein.
Figure 5B:
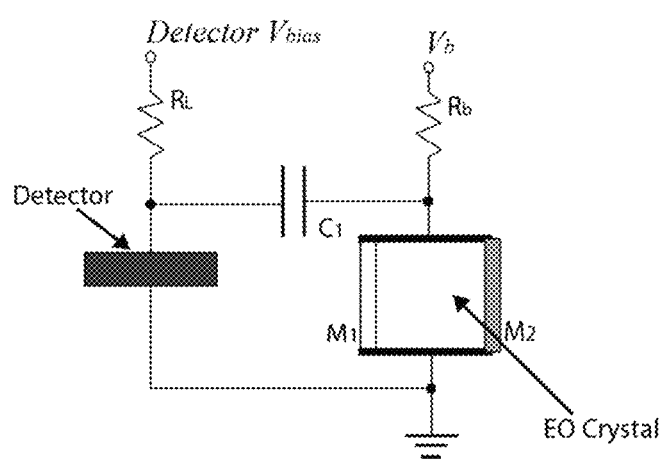
FIG. 5B is schematic diagram of an optical amplifier connected in parallel with a semiconductor detector according to a signal amplifier described herein.

Depending on how the preamplifier is connected to the detector, all or part of $Q_s$ can be detected by our preamplifier. In FIG. 5A, the preamplifier and the detector are in series and sharing one bias voltage. Then all the charge can be measured. In order to be able to connect it like this, the dimension of the EO crystal must be carefully designed to make the capacitance fall in a certain range to divide the shared biased voltage, so both the voltage on the detector and the preamplifier obtain designed values. This should be feasible if the detector is made out of insulating materials (like diamond detector) or the leaking current is small. In FIG. 5B, the conventional connection used in FET preamplifier is used and the preamplifier will only collect part of $Q_s$. However, in the following discussion, to simplify the estimate, all $Q_s$ will be assumed to show up across the EO crystal. In this case, the voltage across the EO crystal is $$v_i = \frac{Q_s}{C} = \frac{Q_s d}{\varepsilon_0 \varepsilon_r A}, \quad (15)$$

This makes use the plate capacitance formula and A is the area of the electrode, $\varepsilon_0$ the vacuum dielectric constant and $\varepsilon_r$ the relative dielectric constant of the EO crystal.

And the SNR due to the photon noise is $$SNR = \sqrt{2N_{tot}\tau}\,\frac{\pi\beta n_e^3 r_{eo} L_0}{\lambda}\,\frac{Q_s}{\varepsilon_0 \varepsilon_r A} = \sqrt{2N_{tot}\tau}\,\frac{\pi\beta n_e^3 r_{eo}}{\lambda}\,\frac{Q_s}{\varepsilon_0 \varepsilon_r s}, \quad (16)$$

where s is the thickness of the crystal in the direction perpendicular to graph shown in FIG. 1. From this equation, in order to choose a good EO crystal, the value $$\frac{n_e^3 r_{eo}}{\varepsilon_r}$$

should be maximized. And SNR only depends on the one dimension of the EO crystal as long as the plate capacitor equation applies (it should apply for the following example within a large range of parameters as $\varepsilon_r$=3400, the electric field lines should be well-confined within the capacitor).

In order to achieve a good energy resolution, the SNR in equation 16 should be comparable to the SNR due to the Fano statistics, which is the fundamental energy resolution limit of a semiconductor detector, $$SNR_{fano} = \sqrt{\frac{E}{FE_i}}, \quad (17)$$

where F is the Fano factor and for silicon, it is about 0.1. For an energy of E=100 keV absorbed by a silicon detector, results in a $SNR_{fano}$=527. Assuming a wavelength of 632 nm (He—Ne laser), a reflectivity R=99% ($\beta$=398), a measuring time x=1 μs, using the properties of Strontium-Barium Niobate ($Sr_xBa_{(1-x)}Nb_2O_6$) (SBN x=0.75), $r_{33}$=1340 pm/V, $E_r$=3400 and $n_e$=2.35 and a thickness s=1 mm, equating $SNR_{fano}$ to SNR in equation 16, we will need $N_{tot}$=5.4×10$^{15}$ photons/s, which equals to a laser power of 1.7 mW which is within the commonly available He—Ne laser range. If even higher detector speed is required, which means a smaller τ, a higher laser power or higher reflectivity will be needed.

Here we only considered the noise from the photon statistics. Other sources of noise will be present in a realistic system, including the laser and detector noise. But they will not be of fundamental nature for this application and we should be able to balance them with a high power laser. In addition, the absorption of the EO crystal will not introduce extra thermal noise because the photon energy (order eV) is very much larger than $k_B T$ (0.026 eV), therefore, the temperature of this optical system is effectively zero. The absorption will merely reduce the number of photons used for amplification and can be compensated by an increase in laser power.

In the above discussion, the EO crystal was configured to use the $r_{33}$ coefficient. If a material with large $T_{eo}$ of other component(s) is found, that should be able to be used with different electrodes and light orientation.

To use this optical amplifier for a 1D or 2D array of detectors, the laser source can be shared. If one powerful laser and a spatial light modulator or simply many beam splitters are used, many laser beams can be generated to be shared by the different preamplifiers of the pixels. By designing this way, many individual pixels plus preamplifiers into a small area detector array may be integrated. And this may lower the cost and make an energy-resolve x-ray or charge particle detector panel feasible. Another approach for array detector is to expand the laser beam to cover the whole detector area and the pixelated detection is done with pixelated photon detector.

Different from optical modulators using Pockels' effect, this optical amplifier does not need a large change in the absolute value of the index, but a sensitive dependence of modulation voltage. Therefore, insulation breakdown of the EO crystal is not an issue as a very large bias voltage will not be needed. If materials with very large $r_{eo}$ but weak insulation power exist, it can be still be used for this application. For SBN x=0.75 and SBN x=0.61, with a small change in Sr component, there is a large change in $r_{33}$ ($\varepsilon_r$ has a large change as well, so $r_{33}/\varepsilon_r$ does not change a lot, still an increase for x=0.75). Presumably, SBN x=0.75 is approaching some kind of transition point and trying to make $r_{33}$ larger by tuning x may make it unstable for optical modulation or photorefractive applications. However, it may be suitable for this optical amplifier application. Therefore this application calls for more material development in increasing the value of $$\frac{n_e^3 r_{eo}}{\varepsilon_r}$$

disregarding many other important factors in other applications.

Similar to scintillator crystals, the EO crystal can suffer from radiation damage. Presumably, the most obvious damage to the EO crystal could be the creation of color centers that absorb the light. This will reduce the signal. But unlike the scintillator crystals, the options exist of either exposing the EO crystal to the radiation or shielding them from the radiation.

Similar to conventional charge sensitive preamplifier, this optical preamplifier will need reset to avoid the charge accumulation on the EO crystal capacitor. The reset methods will be similar as well. The simplest way would be adding a resistor in parallel with the capacitor. However, as a high speed preamplifier, this will add excessive noise. The preferred way would be using active techniques.

Here a Michelson interferometry setup is used to measure the small changes in the index of refraction in the EO crystal. However, there are many different ways to setup the interferometer and other configurations can be used if they are more convenient.

Mechanical vibrations that change the optical path of the order half wavelength will be detrimental to our setup. But this is a rather large vibration for a well-designed optical setup. If vibrations are a problem, it may be possible to encapsulate the whole optical setup in a low-index transparent medium. Or an optical fiber version of the interferometer may be used. In addition, mechanical vibrations are concentrated in low frequency domain (due to acoustic waves from the air and fixtures) and since our measurements will be done very fast (i.e., high frequency domain). This amplifier should be able to tolerate small vibrations of low frequency.

It is shown in that for measuring small position change of an AFM tip, a beam deflection setup is equivalent to a Michelson interferometry setup in SNR. The same conclusion is applicable for measuring the small index refraction change we described above and beam deflection can be used in this setup, although a careful design of optical path may be needed to make use the largest $r_{eo}$ possible and a different component(s) other than $r_{33}$ may be more suitable.

Another attractive feature is that it relies on optical effect for amplification; therefore it can be made more immune to strong RF interference. This can be important since in many applications, the RF shielding is important and hard. This amplifier may find important applications in harsh RF environments, like some military applications.

Another attractive feature is that its input impedance can be varied in a large range and still keep the performance. This makes this amplifier very versatile in different areas of applications. This feature can be seen from equations 8 and 16. The input impedance depends on the capacitance of the EO crystal which can be changed independent from SNR values for both voltage amplifier case and charge amplifier case.

In the above discussion, it is assumed that the photons are independent from each other, therefore Poisson statistics applies and this is normally the case. However, if entangled photons are used to detect, the statistics will be different and it is possible to get the same SNR with less photons or get better SNR with the same number of photons.

The specification and drawings are, accordingly, to be regarded in an illustrative rather than a restrictive sense. It will, however, be evident that various modifications, combinations, and changes may be made thereunto without departing from the broader spirit and scope of the disclosure as set forth in the claims.

The description of the subject technology is provided to enable any person skilled in the art to practice the various embodiments described herein. While the subject technology has been particularly described with reference to the various figures and embodiments, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these embodiments will be readily apparent to those skilled in the art, and generic principles defined herein may be applied to other embodiments. Thus, many changes and modifications may be made to the subject technology, by one having ordinary skill in the art, without departing from the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted.

What is claimed is:

1. An electrical signal amplification system comprising:
   an electrical signal amplifier for amplifying an electrical signal, the electrical signal amplifier having
   an electro-optic (EO) medium for receiving the electrical signal, wherein applying the electrical signal to the EO medium causes a change to an effective index of refraction;
   a device for measuring a light phase change for measuring the change to the effective index of refraction; and
   a photodetector;
   wherein the photodetector converts the change to the effective index of refraction into an amplified electrical current output signal.

2. The amplifier of claim 1 wherein the device configured for measuring the light phase change is an interferometer comprising a monochromatic laser source direct towards the EO medium to measure the change to the effective index of refraction.

3. The amplifier of claim 1 wherein the EO medium comprises a Gires-Tournois elaton (GTE).

4. The amplifier of claim 1 wherein entangled photons are used for detection.

5. The amplifier of claim 1 wherein the EO medium is connected to a semiconductor x-ray/y-ray/charged particle detector for receiving an electrical charge signal generated by the semiconductor x-ray/y-ray/charged particle detector, to act as a charge sensitive detector to measure energy and timing information of particles impacting the radiation detector.

6. The amplifier of claim 5 wherein the radiation detector is connected in series to the EO medium.

7. The amplifier of claim 5 wherein the radiation detector is connected in parallel to the EO medium.

8. An electrical signal amplification system, comprising:
   a semiconductor radiation detector;
   a preamplifier for amplification of an electrical signal for detection by the semiconductor radiation detector, the preamplifier having:
   an electro-optic (EO) medium comprising a first mirror and a second mirror for receiving the electrical signal, wherein applying the electrical signal to the EO medium causes a change to an effective index of refraction;
   a monochromatic laser source configured to emit a laser towards the EO medium directly or indirectly to bounce inside the EO medium many times in order to increase a phase shift of the laser;
   a device for measuring the change to the effective index of refraction; and
   a photodetector;
   wherein the photodetector converts the change to the effective index of refraction into an amplified electrical current output signal.

9. The amplifier of claim 8 wherein the device configured for measuring the light phase change is an interferometer.

10. The amplifier of claim 8 wherein the EO medium comprises a Gires-Tournois etalon (GTE).

11. The amplifier of claim 8 wherein entangled photons are used for detection.

12. The amplifier of claim 8 wherein the EO medium is connected to a semiconductor x-ray/y-ray/charged particle detector for receiving an electrical charge signal generated by the semiconductor x-ray/y-ray/charged particle detector, to act as a charge sensitive detector to measure energy and timing information of particles impacting the radiation detector.

13. The amplifier of claim 12 wherein the radiation detector is connected in series to the EO medium.

14. The amplifier of claim 12 wherein the radiation detector is connected in parallel to the EO medium.

15. A method of amplifying an electrical signal comprising:
   receiving the electrical signal at an electro-optic (EO) medium comprising a first mirror and a second mirror, wherein applying the electrical signal to the EO medium causes a change to an effective index of refraction;
   emitting, using a monochromatic laser source, a laser either directly or indirectly towards the EO medium to bounce inside the EO medium many times in order to increase a phase shift of the laser;
   measuring, using a device, the change to the effective index of refraction; and
   converting, using a photodetector, the change to the effective index of refraction into an amplified electrical current output signal.

16. The method of claim 15 wherein the device is an interferometer configured to measuring the light phase change.

17. The method of claim 15 wherein the EO medium comprises a Gires-Tournois elaton (GTE).

18. The method of claim 15 wherein the EO medium is connected to a semiconductor x-ray/y-ray/charged particle detector for receiving an electrical charge signal generated by the semiconductor x-ray/y-ray/charged particle detector, to act as a charge sensitive detector to measure energy and timing information of particles impacting the radiation detector.

19. The method of claim 18 wherein the radiation detector is connected either in series or parallel to the EO medium.

20. The method of claim 15 wherein entangled photons are used for detection.

* * * * *